(12) United States Patent
Lee et al.

(10) Patent No.: US 8,962,415 B2
(45) Date of Patent: Feb. 24, 2015

(54) METHODS OF FORMING GATES OF SEMICONDUCTOR DEVICES

(71) Applicant: Samsung Electronics Co., Ltd., Suwon-si (KR)

(72) Inventors: Jong-Won Lee, Seongnam-si (KR); Bo-Un Yoon, Seoul (KR); Seung-Jae Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/264,622

(22) Filed: Apr. 29, 2014

(65) Prior Publication Data
US 2014/0235047 A1 Aug. 21, 2014

Related U.S. Application Data

(62) Division of application No. 13/241,957, filed on Sep. 23, 2011, now Pat. No. 8,735,250.

(30) Foreign Application Priority Data

Oct. 6, 2010 (KR) .................. 10-2010-0097326

(51) Int. Cl.
*H01L 21/8238* (2006.01)
*H01L 21/28* (2006.01)
*H01L 29/423* (2006.01)
*H01L 29/49* (2006.01)
*H01L 29/51* (2006.01)
*H01L 29/66* (2006.01)

(52) U.S. Cl.
CPC .... *H01L 21/28008* (2013.01); *H01L 21/28105* (2013.01); *H01L 21/823842* (2013.01); *H01L 29/42376* (2013.01); *H01L 29/49* (2013.01); *H01L 29/513* (2013.01); *H01L 29/66545* (2013.01)
USPC ..... 438/199; 438/216; 438/275; 257/E21.632

(58) Field of Classification Search
USPC .................. 438/199, 216, 275, 287, 591; 257/E21.019, E21.632
See application file for complete search history.

(56) References Cited

U.S. PATENT DOCUMENTS

| | | | |
|---|---|---|---|
| 2006/0081939 A1* | 4/2006 | Akasaka et al. | 257/371 |
| 2009/0236669 A1 | 9/2009 | Chen et al. | |
| 2010/0124818 A1* | 5/2010 | Lee et al. | 438/589 |
| 2013/0020657 A1 | 1/2013 | Lu et al. | |

FOREIGN PATENT DOCUMENTS

| | | |
|---|---|---|
| JP | 2001-024065 | 1/2001 |
| JP | 2001-284466 | 10/2001 |
| JP | 2009-278042 | 11/2009 |

* cited by examiner

*Primary Examiner* — Thanhha Pham
(74) *Attorney, Agent, or Firm* — Myers Bigel Sibley & Sajovec, PA

(57) ABSTRACT

Methods of forming gates of semiconductor devices are provided. The methods may include forming a first recess in a first substrate region having a first conductivity type and forming a second recess in a second substrate region having a second conductivity type. The methods may also include forming a high-k layer in the first and second recesses. The methods may further include providing a first metal on the high-k layer in the first and second substrate regions, the first metal being provided within the second recess. The methods may additionally include removing at least portions of the first metal from the second recess while protecting materials within the first recess from removal. The methods may also include, after removing at least portions of the first metal from the second recess, providing a second metal within the second recess.

15 Claims, 15 Drawing Sheets

METHODS OF FORMING GATES OF SEMICONDUCTOR DEVICES

CROSS-REFERENCE TO RELATED APPLICATIONS

This application is a divisional of U.S. patent application Ser. No. 13/241,957, filed on Sep. 23, 2011, which claims priority under 35 U.S.C. §119 to Korean Patent Application No. 10-2010-0097326, filed on Oct. 6, 2010, the disclosures of which are hereby incorporated by reference in their entireties.

BACKGROUND

The present disclosure relates to methods of forming gates of semiconductor devices.

To reduce gate leakage current, high-k dielectrics have been used as gate insulation films of metal oxide semiconductor field effect transistors (MOSFETs) instead of using silicon oxide. However, high-k dielectrics may not be compatible with polysilicon used for gate electrodes, and a semiconductor device including a high-k dielectric may thus require use of a metal gate electrode.

To meet the requirements of using high-k dielectrics, replacement gate processes have been proposed. In a replacement gate process, gate spacers may be formed adjacent opposing sidewalls of dummy gate electrodes, and the dummy gate electrodes may subsequently be removed. A metal gate may then be formed by filling a space between the gate spacers with a metallic material.

Meanwhile, when a complementary metal oxide semiconductor (CMOS) gate is formed using a replacement gate process, a metal layer made of titanium nitride (TiN) may be formed to form a gate electrode in n-type and p-type transistor regions between gate spacers, which may be formed of an interlayer insulating film. The metal layer on the n-type transistor region may be selectively removed using a mask while allowing only portions of the metal layer on the p-type transistor to remain.

As shown in FIG. 1, in selectively removing a metal layer ML from an n-type transistor region N, a mask layer MA may formed on a p-type transistor region P as a sacrificial layer, and the metal layer ML on the n-type transistor region N may be removed by wet etching. However, even when the mask layer MA is provided, a portion of the metal layer ML on the p-type transistor region P may also be etched during the wet etching.

SUMMARY

Embodiments of the inventive concept may provide methods of forming gates of semiconductor devices. According to some embodiments, the methods include forming first and second dummy gate electrodes on first and second regions of a substrate, respectively. The methods may also include forming gate spacers on opposing sidewalls of each of the first and second dummy gate electrodes. The methods may further include forming an interlayer dielectric film on the gate spacers and on the first and second dummy gate electrodes to provide an n-type transistor in the first region and a p-type transistor in the second region. The methods may additionally include forming first and second recesses in the first and second regions, respectively, by removing the first and second dummy gate electrodes. The methods may also include forming a high-k layer by providing a high dielectric constant material in the first and second recesses and on the interlayer dielectric film. The methods may further include forming a first sacrificial layer on the high-k layer, the first sacrificial layer substantially filling the first and second recesses. The methods may additionally include selectively removing the first sacrificial layer from the second recess while at least a portion of the first sacrificial layer remains in the first recess. The methods may also include providing a first metal within the second recess. The methods may further include, after providing the first metal within the second recess, removing the first sacrificial layer from the first recess and providing a second metal substantially filling the first and second recesses.

In some embodiments, forming the first and second recesses may include removing the first and second dummy gate electrodes by performing at least one of wet etching and dry etching.

In some embodiments, selectively removing the first sacrificial layer from the second recess may include providing a mask layer on the first sacrificial layer in the first and second regions, removing the mask layer from the second region using a photolithography process to expose the first sacrificial layer in the second recess, and removing the exposed first sacrificial layer from the second recess.

In some embodiments, removing the exposed first sacrificial layer may include etching the first sacrificial layer in the second recess by performing at least one of wet etching and dry etching.

In some embodiments, the methods may further include forming a second sacrificial layer on the first metal to substantially fill the second recess.

In some embodiments, the second sacrificial layer may include a same material as the first sacrificial layer.

In some embodiments, the methods may further include, before providing the second metal, removing a portion of the first metal from the second recess, and, after removing the portion of the first metal, providing the second metal on a remaining portion of the first metal within the second recess.

According to some embodiments, methods of forming a gate of a semiconductor device may include forming first and second dummy gate electrodes on first and second regions of a substrate, respectively. The methods may also include forming gate spacers on opposing sidewalls of each of the first and second dummy gate electrodes. The methods may further include forming an interlayer dielectric film on the gate spacers and on the first and second dummy gate electrodes to provide an n-type transistor in the first region and a p-type transistor in the second region. The methods may additionally include forming first and second recesses in the first and second regions, respectively, by removing the first and second dummy gate electrodes. The methods may also include forming a high-k layer by providing a high dielectric constant material in the first and second recesses and on the interlayer dielectric film. The methods may further include providing a first metal on the high-k layer, the first metal substantially filling the first and second recesses. The methods may additionally include selectively removing the first metal from the second recess while at least a portion of the first metal remains in the first recess. The methods may also include, after selectively removing the first metal from the second recess, providing a second metal within the second recess. The methods may further include providing a third metal on the second metal, the third metal substantially filling the second recess.

In some embodiments, forming the first and second recesses may include removing the first and second dummy gate electrodes by performing at least one of wet etching and dry etching.

In some embodiments, substantially filling the first and second recesses with the first metal may be performed at a temperature of about 350° C. to about 400° C.

In some embodiments, selectively removing the first metal from the second recess may include providing a mask layer on the first metal in the first and second regions, removing the mask layer from the second region using a photolithography process to expose the first metal in the second recess, and removing the exposed first metal from the second recess.

In some embodiments, substantially filling the second recess with the third metal may include providing the third metal on the second metal in the first and second regions, and planarizing the third metal to remove the third metal from the first region while a portion of the third metal remains within the second recess in the second region.

In some embodiments, the first and third metals may include a same metal.

In some embodiments, the first and third metals may include aluminum (Al).

In some embodiments, the first and third metals may include titanium nitride (TiN).

According to some embodiments, methods of forming a gate of a semiconductor device may include forming a first recess in a first substrate region having a first conductivity type and forming a second recess in a second substrate region having a second conductivity type. The methods may also include forming a high-k layer in the first and second recesses. The methods may further include providing a first metal on the high-k layer in the first and second substrate regions, the first metal being provided within the second recess. The methods may additionally include removing at least portions of the first metal from the second recess while protecting materials within the first recess from removal. The methods may also include, after removing at least portions of the first metal from the second recess, providing a second metal within the second recess.

In some embodiments, the methods may also include forming a sacrificial layer on the high-k layer, the sacrificial layer substantially filling the first and second recesses. The methods may further include removing the sacrificial layer from the second recess while at least a portion of the sacrificial layer remains in the first recess. Additionally, the methods may include, after removing the sacrificial layer from the second recess, providing the first metal within the second recess while at least a portion of the sacrificial layer remains in the first recess. The methods may also include, after providing the first metal within the second recess, removing the sacrificial layer from the first recess and providing the second metal to substantially fill the first and second recesses. Moreover, in some embodiments, the second metal may be provided on a remaining portion of the first metal within the second recess.

In some embodiments, the methods may further include providing a third metal on the second metal within the second recess while the first metal remains in the first recess. Also, the first and third metals may include a same metal.

In some embodiments, providing the third metal on the second metal within the second recess may include providing the third metal on the second metal in the first and second substrate regions, and planarizing the third metal to remove the third metal from the first substrate region while a portion of the third metal remains within the second recess in the second substrate region.

In some embodiments, removing at least portions of the first metal from the second recess may include providing a mask layer on the first metal in the first and second substrate regions, removing the mask layer from the second substrate region using a photolithography process to expose the first metal in the second recess, and removing the exposed first metal from the second recess.

BRIEF DESCRIPTION OF THE DRAWINGS

The above and other features and advantages of the disclosure will become more apparent by describing in detail example embodiments thereof with reference to the attached drawings in which.

DETAILED DESCRIPTION

Figure 1:
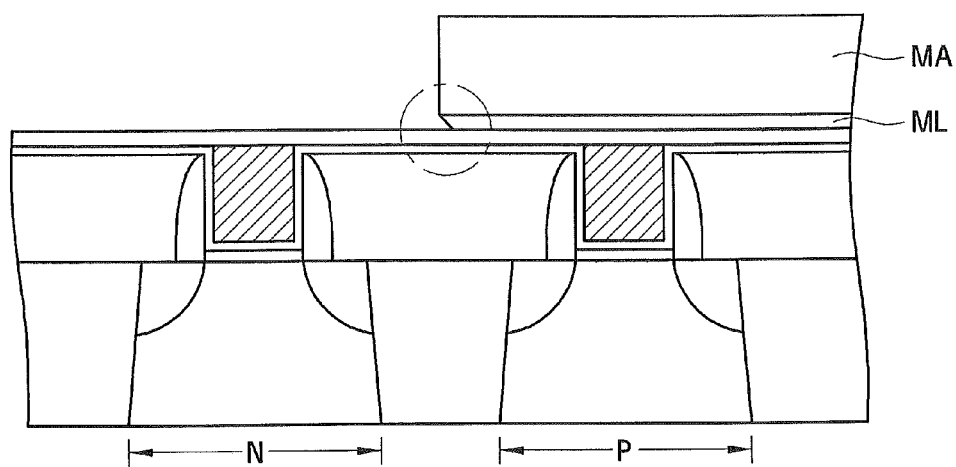
FIG. 1 illustrates a conventional method of forming a gate of a semiconductor device.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to some embodiments, a method of forming a gate of a semiconductor device may include forming gate spacers adjacent opposing sidewalls of dummy gate electrodes. The method may also include forming an interlayer dielectric film on a first region and a second region of a substrate to provide an n-type transistor in the first region and a p-type transistor in the second region. The method may further include forming first and second recesses in the first and second regions by removing the dummy gate electrodes. The method may additionally include forming a high-k layer on the substrate by providing a high dielectric constant material. The method may also include filling the first and second recesses with a first sacrificial layer, and selectively removing the first sacrificial layer from the second recess. The method may further include depositing a first metal on an inner wall of the second recess, removing the first sacrificial layer from the second recess, and filling the first and second recesses with a second metal.

Figure 2:
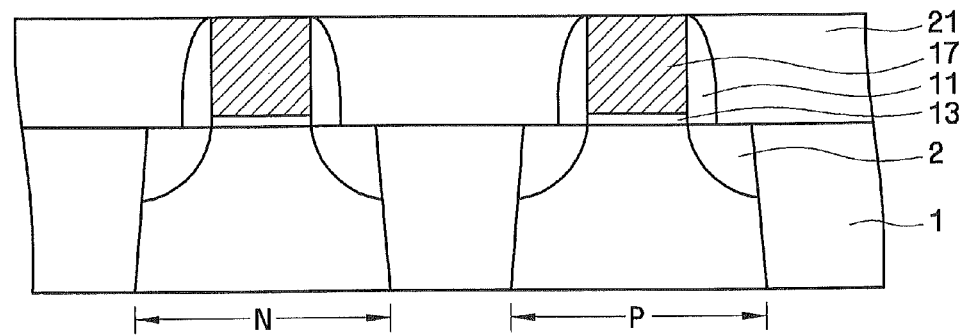
FIGS. 2 to 18 illustrate a method of forming a gate of a semiconductor device according to some embodiments.

Referring to FIG. 2, a gate electrode of a semiconductor device may include source/drain regions 2, a gate insulating layer 13, gate spacers 11, and dummy gate electrodes 17 formed on a substrate 1.

The substrate 1 may be a bulk silicon or a silicon-on-insulator (SOI). Alternatively, the substrate 1 may be a silicon substrate, or a substrate including another material, for example, a semiconductor material such as germanium, indium antimonide, lead telluride, indium arsenide, indium phosphide, and gallium antimonide. Additionally, the substrate 1 may be a substrate such as a silicon-on-insulator (SOI) substrate, a rigid substrate such as a quartz substrate or a glass substrate for a display, or a flexible plastic substrate made of polyimide, polyethylene terephthalate (PET), polyethylene naphthalate (PEN), polymethyl methacrylate (PMMA), polycarbonate (PC), polyester sulfone (PES), or polyester.

Materials that form the gate insulating layer 13, the dummy gate electrodes 17, and a gate hard mask (not shown) may be sequentially formed on the substrate 1 and patterned, thereby forming a stacked structure including the gate insulating layer 13, the dummy gate electrodes 17, and the gate hard mask (not shown). Subsequently, a series of processes may be performed to form the gate spacers 11 along/adjacent opposing sidewalls of the stacked structure.

The gate insulating layer 13 may include, for example, a silicon oxide layer, a high-k dielectric, a combination layer of the silicon oxide layer and the high-k dielectric, or a stacked layer of these layers. The gate insulating layer 13 may be formed by deposition, which may be performed by, for example, chemical vapor deposition (CVD), physical vapor deposition (PVD), or atomic layer deposition (ALD).

The dummy gate electrodes 17 may be made of polysilicon by deposition. In addition, the dummy gate electrodes 17 may be formed to a thickness in a range of, for example, about 500 to about 2000 Å, but not limited thereto. The dummy gate electrodes 17 may subsequently be replaced by metal gate electrodes.

The gate hard mask (not shown) may be made of silicon nitride. In addition, the gate hard mask may be formed to a thickness in a range of, for example, about 100 to about 1000 Å, but not limited thereto.

The gate spacers 11 may be formed by depositing an insulating material. For example, the gate spacers 11 may be formed by depositing the insulating material to substantially the same thickness on substantially the entire surface of the stacked structure, which may include the gate insulating layer 13, the dummy gate electrodes 17, and the gate hard mask (not shown) sequentially stacked on the substrate 1. After depositing the insulating material, forming the gate spacers 11 may further include etching, such as anisotropically etching, the insulating material. The gate spacers 11 may be made of for example, silicon nitride.

After forming the gate insulating layer 13, the dummy gate electrodes 17, the gate hard mask (not shown), and the gate spacers 11 on the substrate 1, the source/drain regions 2 may be formed in the substrate 1 on opposing sides of the gate spacers 11. The source/drain regions 2 may be formed by ion implanting an n-type impurity (e.g., phosphorus (P) or arsenic (As) given an NMOS region N) or a p-type impurity (e.g., boron (B) given a PMOS region P), followed by an annealing process.

After forming the gate spacers 11, an interlayer dielectric film 21 may be formed on substantially the entire surface of the resultant structure. The interlayer dielectric film 21 may be planarized, such as by a chemical mechanical polishing (CMP) process, thereby exposing top surfaces of the dummy gate electrodes 17. For example, the interlayer dielectric film 21 may be planarized such that a top surface of the interlayer dielectric film is substantially coplanar with top surfaces of the dummy gate electrodes 17. The interlayer dielectric film 21 may be formed of an insulating material (e.g., silicon oxide) by deposition (e.g., high density plasma deposition).

Figure 3:
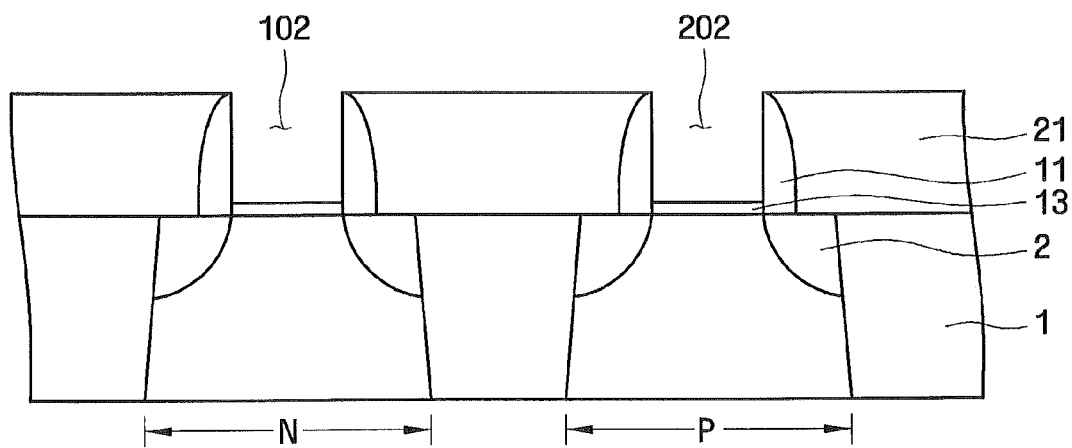

Referring to FIG. 3, the dummy gate electrodes 17 may be etched (e.g., using plasma based dry etching and/or hydride solution based wet etching), thereby forming a first recess 102 in the first region N and a second recess 202 in the second region P.

In plasma based dry etching, a source gas is ionized to generate plasma, and the generated plasma is made to collide with a substrate, thereby etching the substrate as desired. Usable examples of the source gas may include a combination gas of nitrogen trifluoride ($NF_3$), hydrogen bromide (HBr), and chlorine ($Cl_2$). In embodiments where the combination gas of $NF_3$, HBr and $Cl_2$ is used as the source gas, portions of the dummy gate electrodes 17 (made of, e.g., polysilicon) and portions of the gate spacers 11 (made of, e.g., silicon oxide) may be simultaneously etched. However, the source gas is not limited to the combination gas of $NF_3$, HBr, and $Cl_2$.

In addition, a width of the first and second recess 102, 202 and a profile slope of an upper region of the gate spacers 11 can be adjusted by adjusting a time for performing the plasma based dry etching. In other words, if other conditions remain the same, increasing the etching time for the gate spacers 11 will increase the width of the first and second recess 102, 202 and provide a gentler profile slope of the upper region of the gate spacers 11.

Meanwhile, with the wet etching, the dummy gate electrodes 17 may be removed through exposure to an aqueous solution including a hydride source at a sufficiently high temperature for a sufficiently long time. The hydride source may include, for example, ammonium hydroxide or tetraalkyl ammonium hydroxide, but is not limited thereto.

The first recess 102 and the second recess 202, which may be used for forming a buried gate, may be formed by etching (e.g., dry etching or wet etching) the dummy gate electrodes 17.

Figure 4:
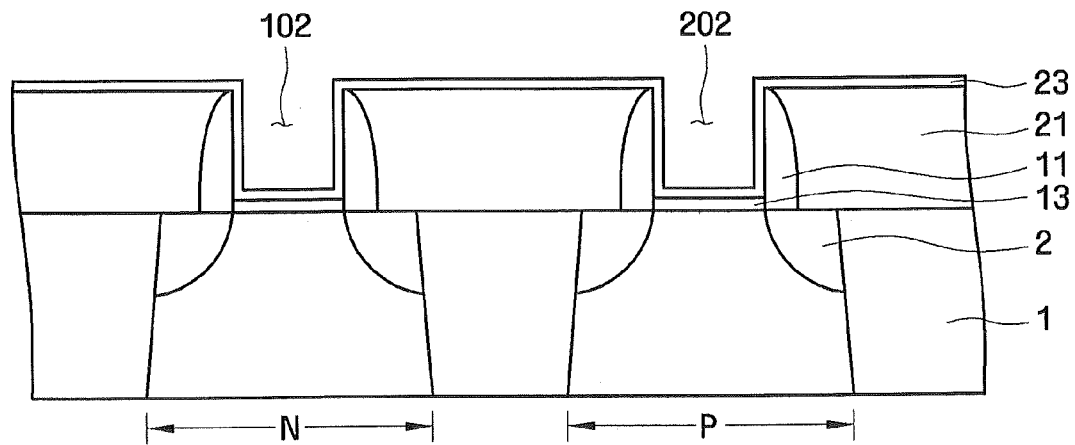

Referring to FIG. 4, after forming the first recess 102 and the second recess 202, a high-k layer 23 may be formed on substantially the entire surface of the resultant structure. A material forming the high-k layer 23 may include, for example, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Figure 5:
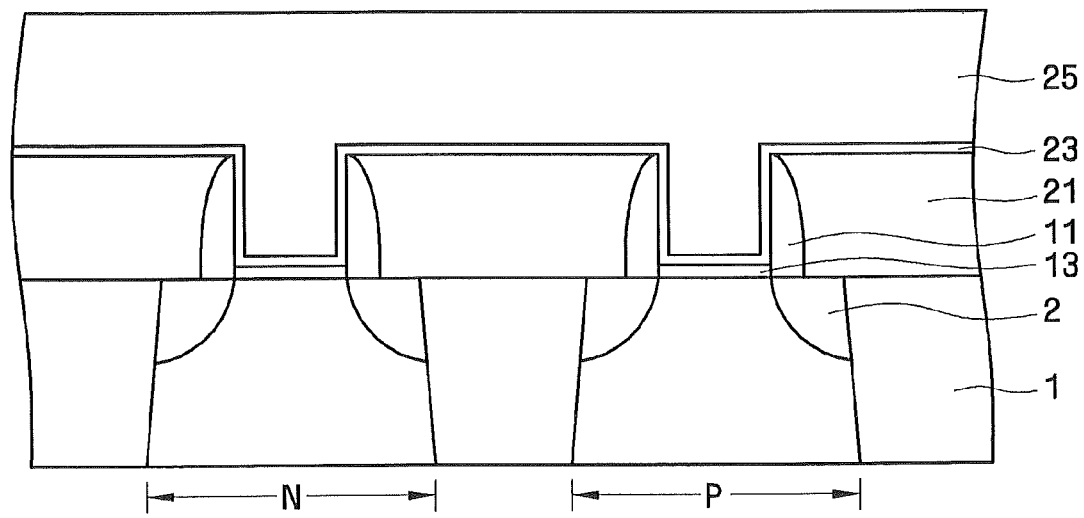

Referring to FIG. 5, after forming the high-k layer 23, a first sacrificial layer 25 may be deposited on substantially the entire surface of the resultant structure. As shown in FIG. 5, the first sacrificial layer 25 may be formed to a thickness that is great enough to substantially fill the first and second recesses 102 and 202. The first sacrificial layer 25 may be formed by mixing one or more materials, such as at least one of spin-on-glass oxide, polysilicon, and organic polymer.

The first sacrificial layer 25 may be formed by spin coating. Spin coating may exhibit a good gap filling characteristic in filling a narrow space between the first and second recesses 102 and 202. Therefore, the first sacrificial layer 25 may relatively easily fill the first and second recesses 102 and 202 without leaving a gap between the first and second recesses 102 and 202.

Figure 6:
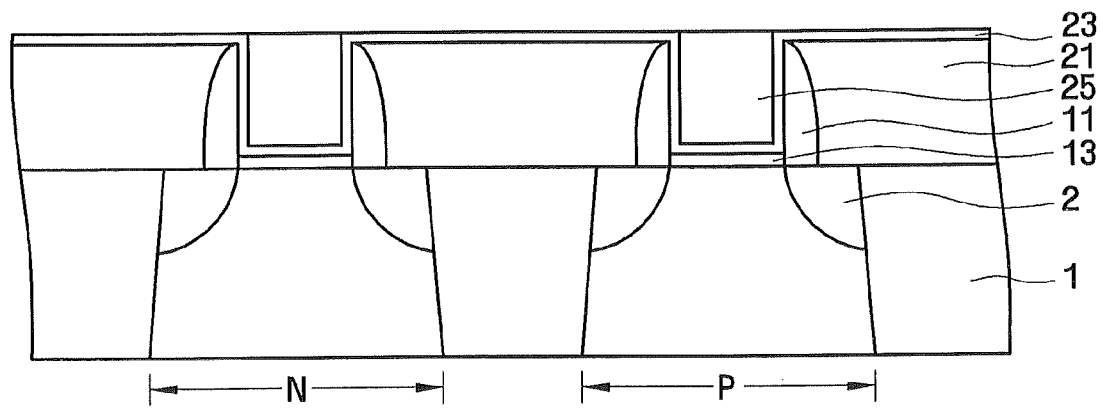

Referring to FIG. 6, a top/residual portion of the first sacrificial layer 25 may be removed while maintaining at least a portion of the first sacrificial layer 25 filling the first and second recesses 102 and 202. Non-limiting examples of the method of removing the first sacrificial layer 25 may include a planarizing process, a wet etching process, and a dry etching process.

In particular, if the first sacrificial layer 25 is made of spin-on-glass oxide or organic polymer, the wet etching process or the dry etching process may be used relatively effectively to remove the first sacrificial layer 25. It may be effective to use a gas or an etching solution having an etching selectivity of the first sacrificial layer 25 with respect to the interlayer dielectric film 21 of at least about 2:1. Alternatively, it may be effective to use a gas or an etching solution having an etching selectivity of the first sacrificial layer 25 with respect to the high-k layer 23 of at least about 2:1.

However, if the first sacrificial layer 25 is made of polysilicon, a planarizing process may be used to remove the first sacrificial layer 25. A slurry used in the planarizing process may have a selectivity of at least about 2:1 with respect to the interlayer dielectric film 21.

Figure 7:
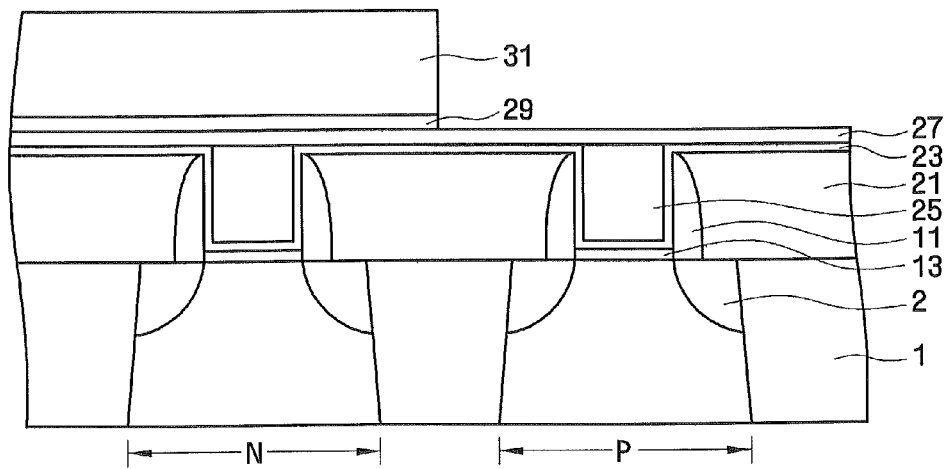

Referring to FIG. 7, first and second mask layers 27 and 29 and a photoresist layer 31 for a photolithography process may be provided on upper portions of the first and second recesses 102 and 202, which may be filled with the first sacrificial layer 25. Exposure and developing processes may be performed to selectively remove at least a top portion of the photoresist layer 31 from the second region P. After removing at least a portion of the photoresist layer 31 from the second region P, portions of the second mask layer 29 on the second region P may be etched using portions of the photoresist layer 31 that remain in the first region N as a mask.

Figure 8:
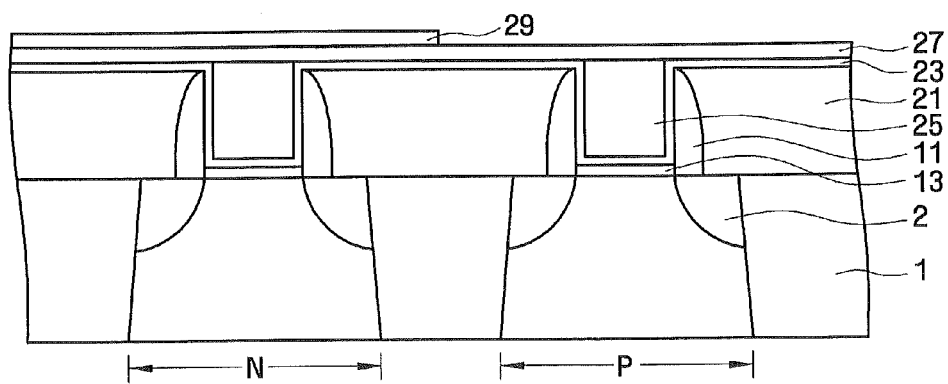
Figure 9:
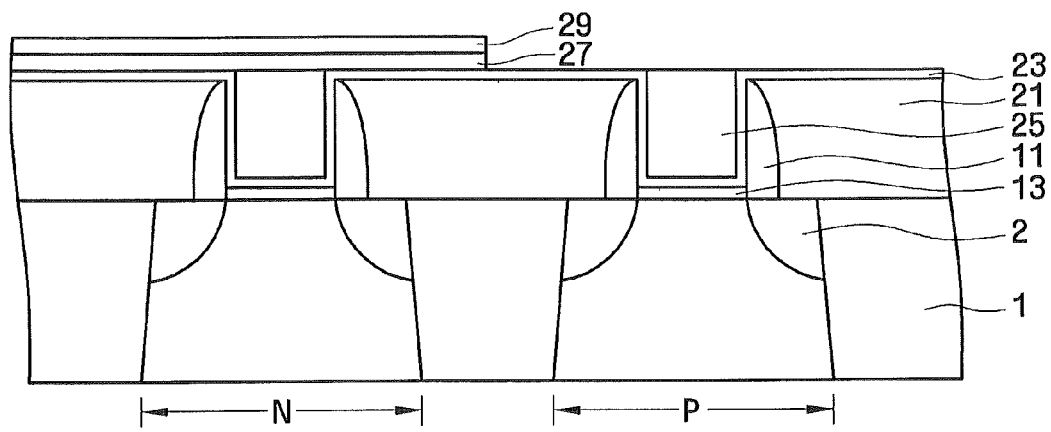
Figure 10:
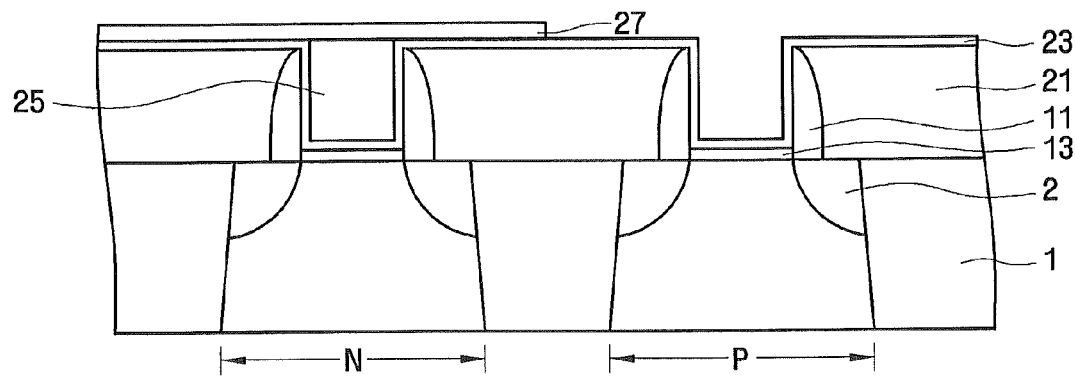

Referring to FIGS. 8 to 10, after etching the second mask layer 29 in the second region P, the portions of the photoresist layer 31 that remain in the first region N may be removed. Referring to FIG. 9, the first mask layer 27 on the second region P may be etched using the second mask layer 29 in the first region N as a mask. Referring to FIG. 10, the portions of the second mask layer 29 remaining in the first region N may be removed while maintaining at least a portion of the first mask layer 27 as a mask in the first region N. The first and/or second mask layers 27 and 29 may be removed in part or in whole using an etching process (e.g., a wet etching process and/or a dry etching process). After removing the portions of the second mask layer 29 remaining in the first region N, the portions of the first sacrificial layer 25 that fill the second recess 202 may be removed using the first mask layer 27 in the first region N as a mask. Also, these portions of the first sacrificial layer 25 may be removed using a wet etching process and/or a dry etching process.

Figure 11:
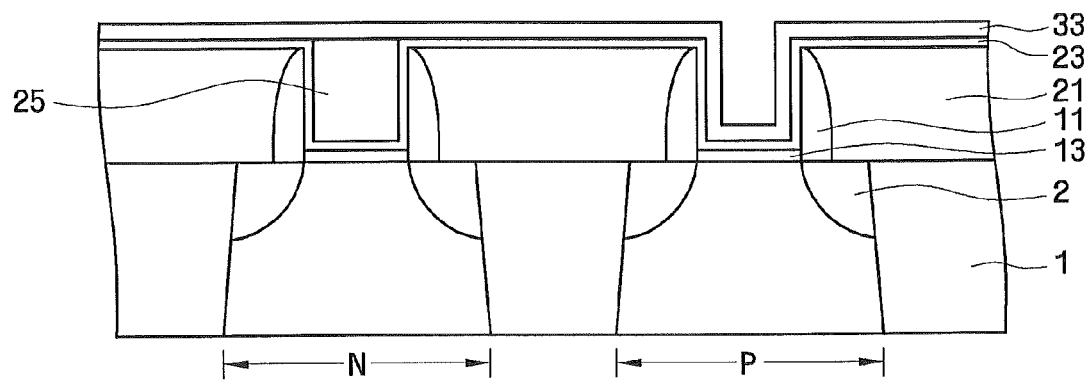

Referring to FIG. 11, after removing the portions of the first sacrificial layer 25 that fill the second recess 202, a first metal layer 33 may be deposited on substantially the entire surface of the substrate 1. The first mask layer 27 in the first region N may be removed after the etching process. As shown in FIG. 11, the first metal layer 33 may be formed on a top portion of the substrate 1 (e.g., on a top surface of the high-k layer 23). For example, the first metal layer 33 may be formed on an inner surface of the open/partially-unfilled second recess 202 (e.g., on portions of the high-k layer 23 that are within opposing sidewalls of the second recess 202). The first metal layer 33 may be formed to a substantially uniform thickness. In some embodiments, the first metal layer 33 may be deposited in the second region P, but not the first region N, because of the first mask layer 27 remaining in the first region N. After depositing the first metal layer 33, the first mask layer 27 remaining in the first region N may be removed. The first metal layer 33 may be used to form a gate electrode. The first metal layer 33 may be made of a metal such as tungsten (W), aluminum (Al), copper (Cu), titanium (Ti), or tantalum (Ta); a metallic nitride such as tungsten nitride (WN), titanium nitride (TiN), tantalum nitride (TaN), or boron nitride (BN); or polysilicon. Accordingly, the first metal layer 33 illustrated in FIG. 11 may include, for example, titanium nitride (TiN).

Figure 12:
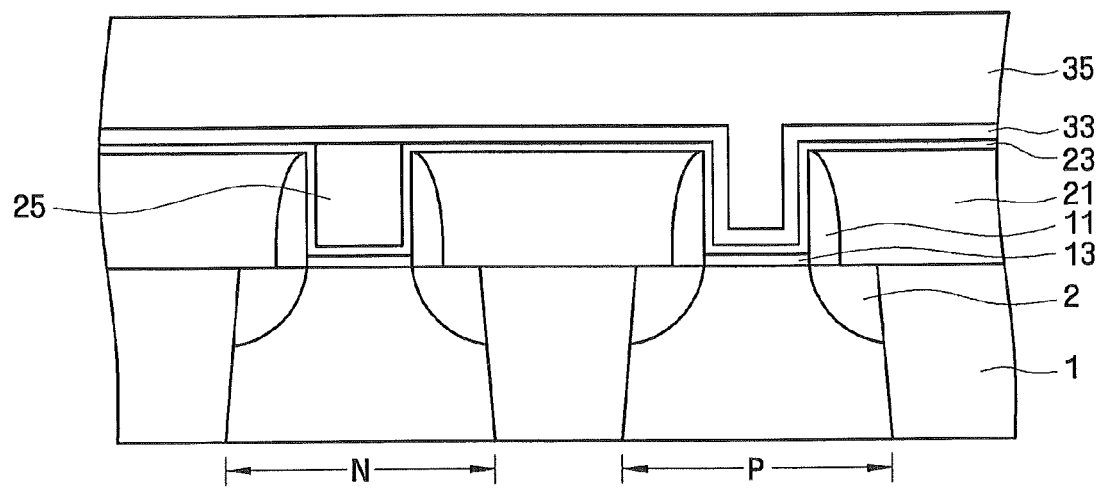

Next, referring to FIG. 12, a second sacrificial layer 35 may be formed on an upper portion of the first metal layer 33. In particular, the second sacrificial layer 35 may be formed to a thickness that is great enough to substantially fill the open/partially-unfilled second recess 202 in the second region P. The second sacrificial layer 35 may be formed by mixing one or more materials such as spin-on-glass oxide, polysilicon, and organic polymer. For example, the second sacrificial layer 35 may be made of the same material as the first sacrificial layer 25.

Figure 13:
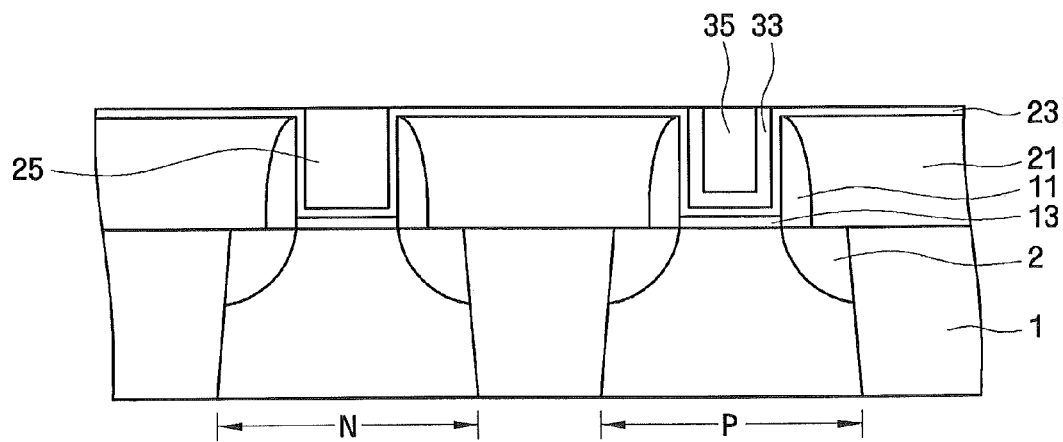

Referring to FIG. 13, a top/residual portion of the second sacrificial layer 35 may be removed while maintaining at least a portion of the second sacrificial layer 35 that fills the second recess 202 in the second region P. Non-limiting examples of the method of removing the second sacrificial layer 35 may include a planarizing process, a wet etching process, and a dry etching process.

In particular, if the second sacrificial layer 35 is made of spin-on-glass oxide or organic polymer, the wet etching process or the dry etching process may be used relatively effectively to remove the second sacrificial layer 35. It may be relatively effective to use a gas or an etching solution having an etching selectivity of the second sacrificial layer 35 with respect to the interlayer dielectric film 21, or of the second sacrificial layer 35 with respect to the high-k layer 23, of at least about 2:1.

It may also be relatively effective to use a gas or an etching solution having an etching selectivity of the second sacrificial layer 35 with respect to the first metal layer 33 of at least about 2:1.

However, if the second sacrificial layer 35 is made of polysilicon, a planarizing process may be used in removing the second sacrificial layer 35. A slurry used in the planarizing process may have a selectivity of at least 2:1 with respect to the first metal layer 33.

As shown in FIG. 13, after forming the second sacrificial layer 35, the top surface of the resultant structure may be planarized, and portions of the first metal layer 33 and the second sacrificial layer 35 may be exposed. For example, the exposed portions of the first metal layer 33 and the second sacrificial layer 35 may be substantially coplanar with each other and/or with a top surface of the high-k layer 23.

Figure 14:
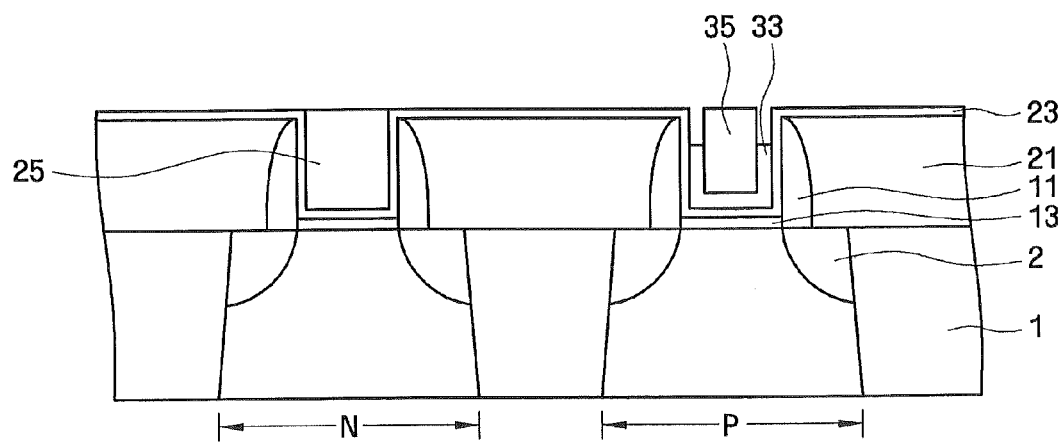

Referring to FIG. 14, a portion of the exposed portions of the first metal layer 33 may be removed. Accordingly, the occurrence of voids in the second recess 202 upon depositing an electrode layer 37 and a second metal layer 39 may be reduced. In particular, removing a portion of the exposed portions of the metal layer 33 may reduce voids in a residual space of the second recess 202 by reducing a gate aspect ratio. An etching process may be used to etch the first metal layer 33. For example, a dry etching process using a gas having a selectivity of at least about 2:1 with respect to the high-k layer 23, and/or a wet etching process using an etching solution having a selectivity of at least about 2:1 with respect to the underlying high-k layer 23, may be used to etch the first metal layer 33. Removal of a portion of the exposed portions of the first metal layer 33 may be performed during the process of removing the second sacrificial layer 35 shown in FIG. 13.

Figure 15:
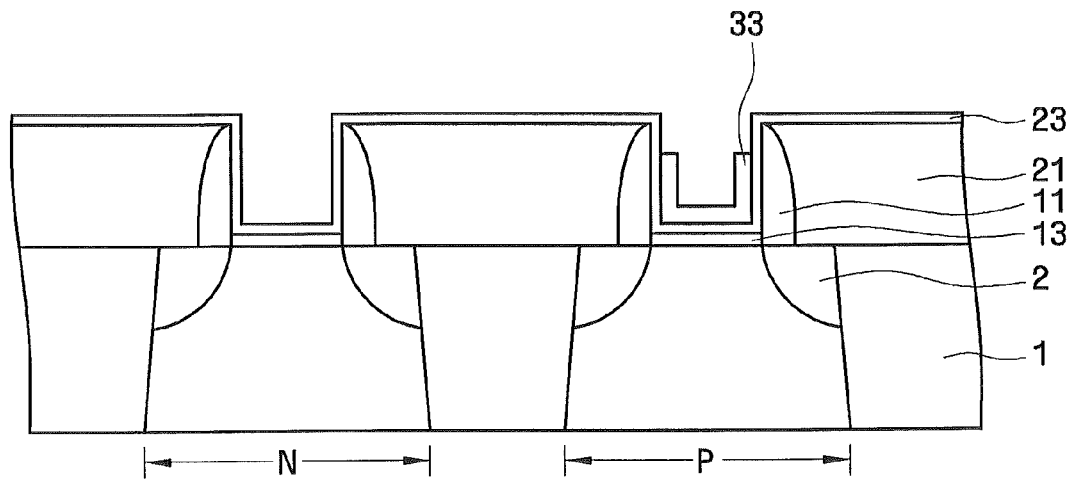

Referring to FIG. 15, the portions of the first sacrificial layer 25 and the second sacrificial layer 35 that remain inside the first and second recesses 102 and 202, respectively, may be removed. These remaining portions of the first sacrificial layer 25 and the second sacrificial layer 35 may be removed by wet etching or dry etching. Also, it may be understood by one skilled in the art that the specific etching choices/conditions implemented may vary according to the kind (e.g., material) of the sacrificial layer 25, 35 that is used.

Figure 16:
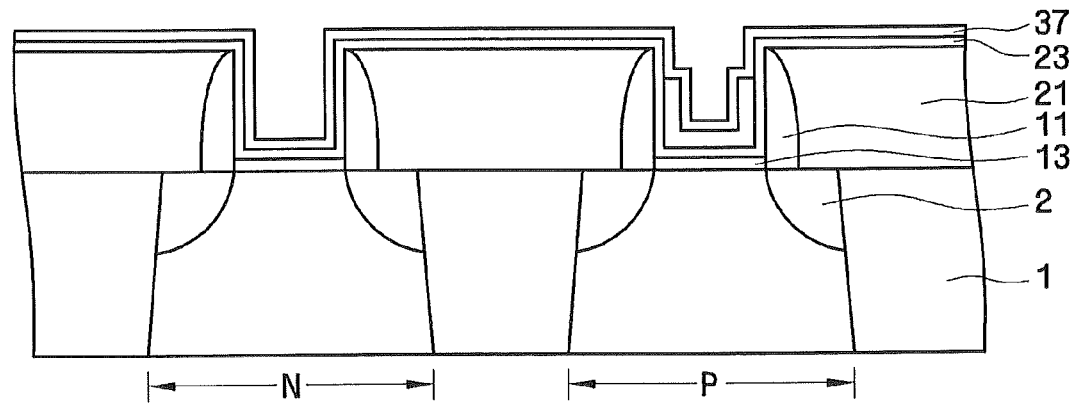

Referring to FIG. 16, the electrode layer 37 may be deposited on the substrate 1. Examples of a material forming the electrode layer 37 may include a metal such as tungsten (W), aluminum (Al), copper (Cu), titanium (Ti), or tantalum (Ta); a metal nitride such as tungsten nitride (WN), titanium nitride (TiN), tantalum nitride (TaN) or boron nitride (BN); or polysilicon, and so on. Accordingly, the electrode layer 37 illustrated in FIG. 16 may include, for example, titanium nitride (TiN).

Figure 17:
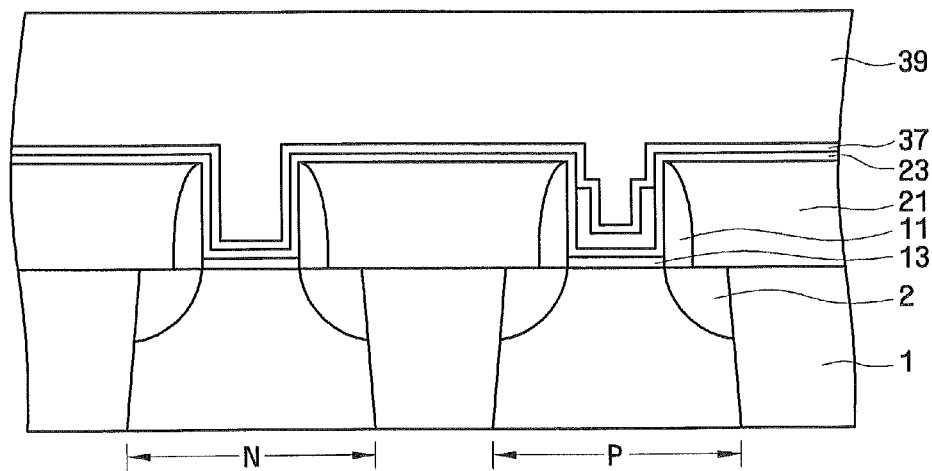
Figure 18:
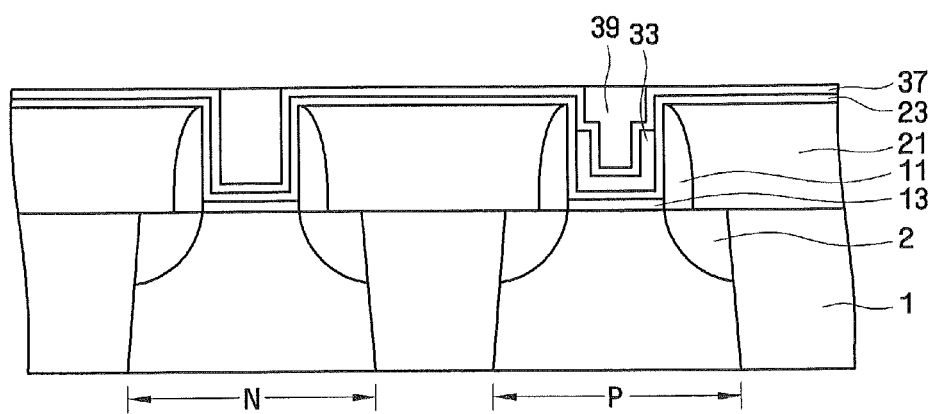

Next, referring to FIGS. 17 and 18, the second metal layer 39 may be formed on the electrode layer 37 to a thickness great enough to substantially fill the first and second recesses 102 and 202. The second metal layer 39 may be made of a metal such as tungsten (W), aluminum (Al), copper (Cu), titanium (Ti), or tantalum (Ta); a metal nitride such as tungsten nitride (WN), titanium nitride (TiN), tantalum nitride (TaN), or boron nitride (BN); or polysilicon, or the like. Accordingly, the second metal layer 39 illustrated in FIGS. 17 and 18 may include, for example, aluminum (Al).

Next, a planarizing process may be performed on the second metal layer 39 to make the second metal layer 39 and the electrode layer 37 have substantially the same height. As a result of the planarizing process performed on the second metal layer 39, portions (e.g., sectional surfaces) of the electrode layer 37 and the second metal layer 39 may be exposed.

In some embodiments, assuming, for example, that the first metal layer 33 includes TiN, the TiN forming the first metal layer 33 may not be formed in the first region N. Thus, a removal process of TiN may not be necessary, and it may be possible to prevent the TiN of the first metal layer 33 in the second region P from being damaged due to the wet etching.

A method for forming a gate of a semiconductor device according to some embodiments includes forming dummy gate electrodes and forming gate spacers adjacent opposing sidewalls of the dummy gate electrodes. The method may also include forming an interlayer dielectric film on a first and second regions of a substrate, and providing an n-type transistor in the first region and a p-type transistor in the second region. The method may further include forming first and second recesses in the first and second regions by removing the dummy gate electrodes. The method may additionally include forming a high-k layer on the substrate by providing a high dielectric constant material. The method may also include filling the first and second recesses with a first metal, and selectively removing the first metal of the second recess. The method may further include depositing a second metal on the inner wall of the second recess, and filling a residual space of the second recess with the first metal.

Figure 19:
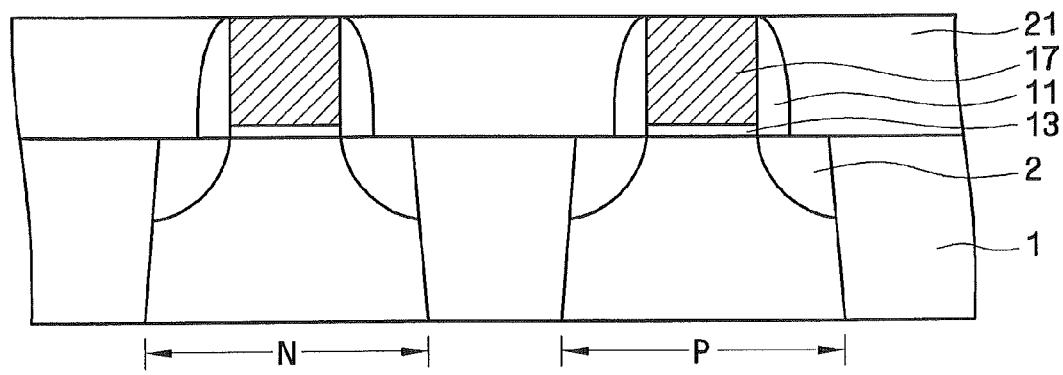
FIGS. 19 to 30 illustrate a method of forming a gate of a semiconductor device according to some embodiments.

Referring to FIG. 19, the gate electrode of the illustrated semiconductor device may include source/drain regions 2, a gate insulating layer 13, gate spacers 11, and dummy gate electrodes 17 formed on a substrate 1.

The substrate 1 may be a bulk silicon or a silicon-on-insulator (SOI). Alternatively, the substrate 1 may be a silicon substrate, or a substrate made of another material, for example, a semiconductor material such as germanium, indium antimonide, lead telluride, indium arsenide, indium phosphide, and gallium antimonide. The substrate 1 illustrated in FIG. 19 may be the same as the substrate 1 illustrated in FIG. 2.

Materials that form the gate insulating layer 13, the dummy gate electrodes 17, and a gate hard mask (not shown) may be sequentially formed on the substrate 1 and patterned, thereby forming a sequentially stacked structure including the gate insulating layer 13, the dummy gate electrodes 17 and the gate hard mask (not shown). Subsequently, a series of processes may be performed to form the gate spacers 11 adjacent opposing sidewalls of the stacked structure.

The gate insulating layer 13 may be a silicon oxide layer, a high-k dielectric, a combination thereof, or a stacked layer of these layers, but is not limited thereto. The gate insulating layer 13 illustrated in FIG. 19 may be the same as the gate insulating layer 13 illustrated in FIG. 2.

The dummy gate electrodes 17 may be made of polysilicon using deposition. In addition, the dummy gate electrodes 17 may be formed to a thickness in a range of, for example, about 500 to about 2000 Å, but is not limited thereto. The dummy gate electrodes 17 illustrated in FIG. 19 may replaced by metal gate electrodes in a subsequent process, as may also be the case for the dummy gate electrodes illustrated in FIG. 2.

Additionally, because configurations of the gate hard mask (not shown), the gate spacers 11, the gate insulating layer 13, and the dummy gate electrodes 17 illustrated in FIG. 19 may be the same as those of the gate hard mask (not shown), the gate spacers 11, the gate insulating layer 13, and the dummy gate electrodes 17 illustrated in FIG. 2, repeated descriptions thereof may be omitted.

An interlayer dielectric film 21 may be formed on substantially the entire surface of the resultant structure and may be planarized by a chemical mechanical polishing (CMP) process, thereby exposing top surfaces of the dummy gate electrodes 17. The interlayer dielectric film 21 may be made of an insulating material (e.g., silicon oxide) by deposition (e.g., high density plasma deposition).

Figure 20:
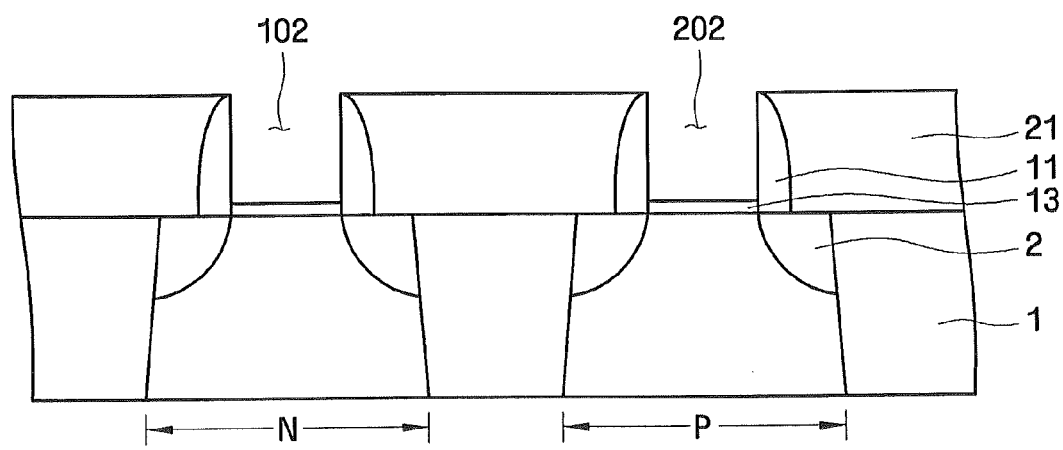

Referring to FIG. 20, the dummy gate electrodes 17 may be etched using plasma based dry etching and/or hydride solution based wet etching, thereby forming a first recess 102 in the first region N and a second recess 202 in the second region P.

As the plasma based dry etching and the hydride solution based wet etching for the first and second recesses 102, 202 in FIG. 20 may be the same as described regarding FIG. 3, descriptions thereof may be omitted.

Figure 21:
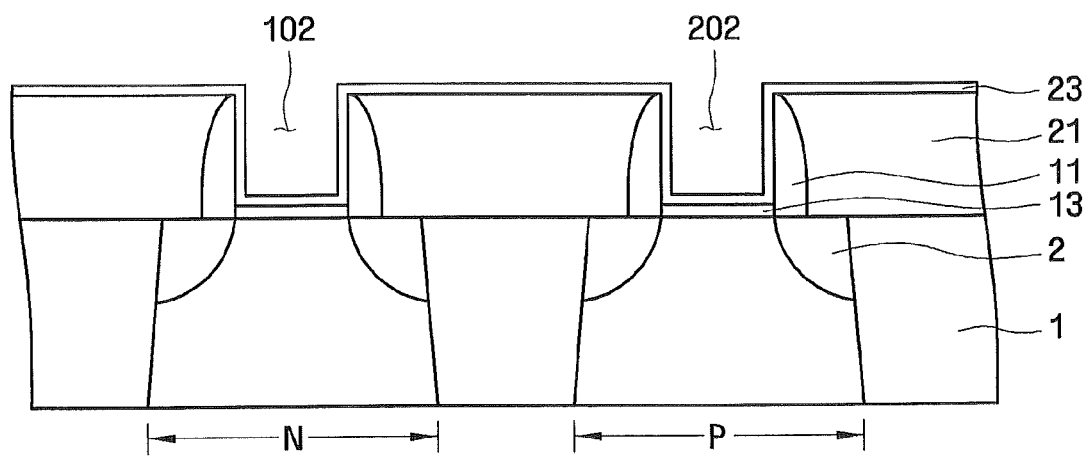

Referring to FIG. 21, after forming the first and second recesses 102, 202, a high-k layer 23 may be formed on substantially the entire surface of the resultant structure. A material forming the high-k layer 23 may include, for example, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Figure 22:
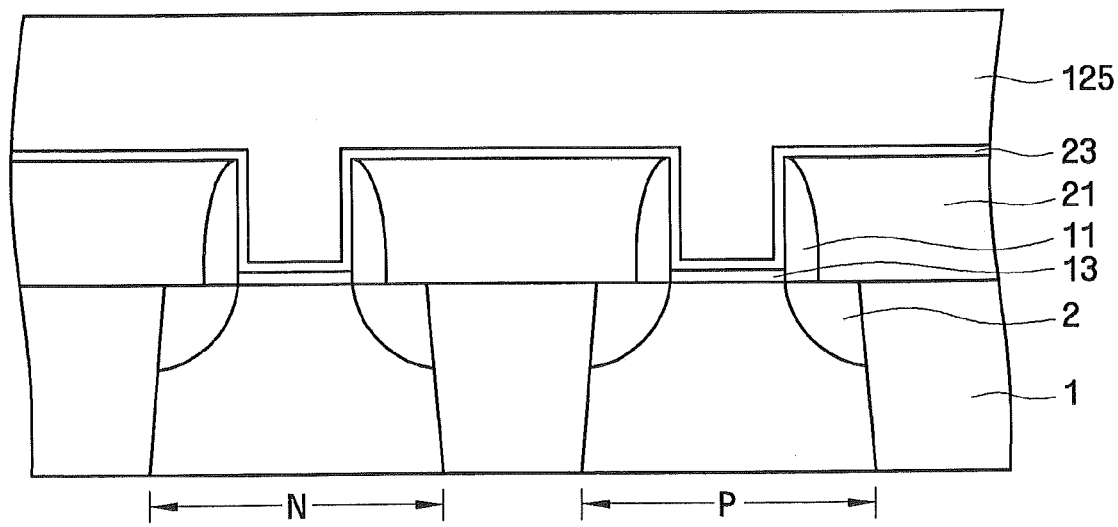

Referring to FIG. 22, after forming the high-k layer 23, a first metal layer 125 may be deposited on substantially the entire surface of the resultant structure. As shown in FIG. 22, the first metal layer 125 may be formed to a thickness great enough to substantially fill the first and second recesses 102, 202. The first metal layer 125 may be formed by a metal such as tungsten (W), aluminum (Al), copper (Cu), titanium (Ti), or tantalum (Ta); a metallic nitride such as tungsten nitride (WN), titanium nitride (TiN), tantalum nitride (TaN), or boron nitride (BN); or polysilicon. Accordingly, the first metal layer 125 illustrated in FIG. 22 may include, for example, aluminum (Al). If the first metal layer 125 includes aluminum (Al), it may be necessary to appropriately adjust the temperature to prevent a gate from deteriorating due to diffusion of aluminum (Al) particles in the second region P. The deposition of aluminum (Al) may be performed at a temperature in a range of about 350 to about 400° C.

Figure 23:
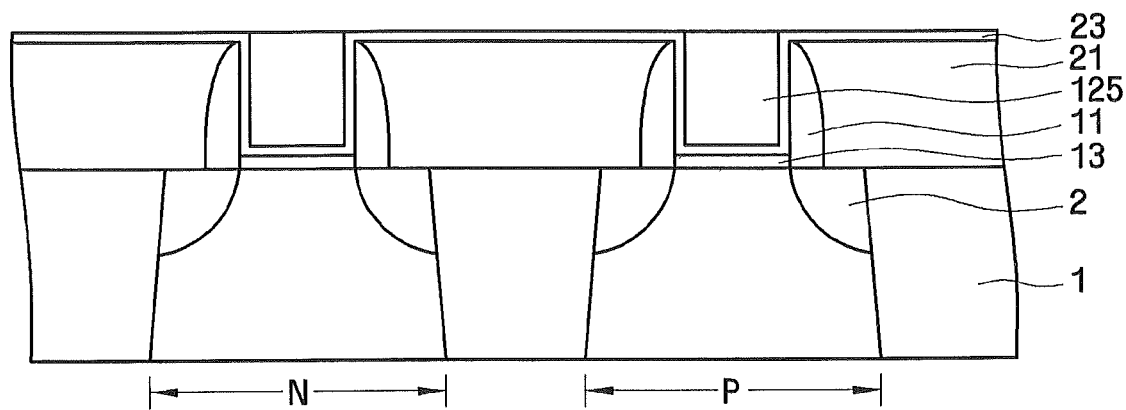
Figure 24:
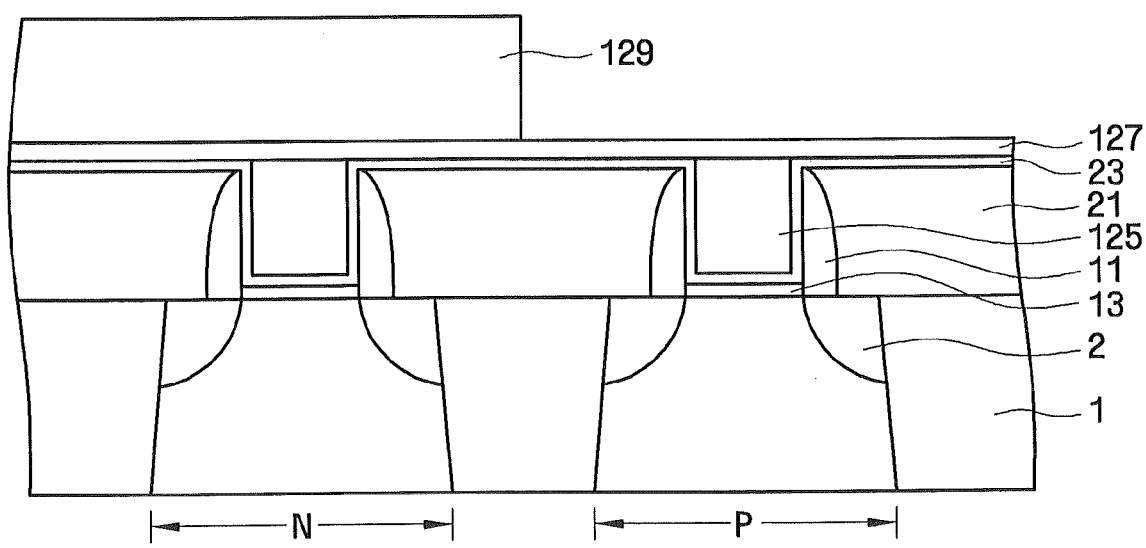

Referring to FIG. 23, a top/residual portion of the first metal layer 125 may be removed while maintaining portions of the first metal layer 125 that fill the first and second recesses 102, 202. Non-limiting examples of the method of removing the top/residual portion of the first metal layer 125 may include a planarizing process, a wet etching process, and a dry etching process.

In particular, when the first metal layer 125 (e.g., aluminum (Al)) is removed, it may be effective to use a gas, slurry, or an etching solution having an etching selectivity of the first metal layer 125 with respect to the interlayer dielectric film 21, or of the first metal layer 125 with respect to the high-k layer 23, of at least about 2:1.

Figure 25:
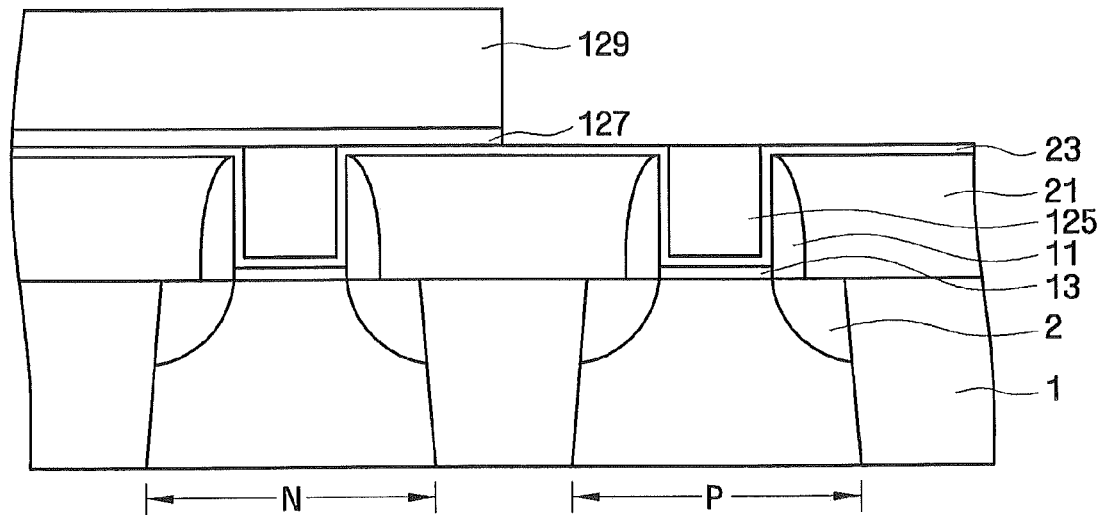
Figure 26:
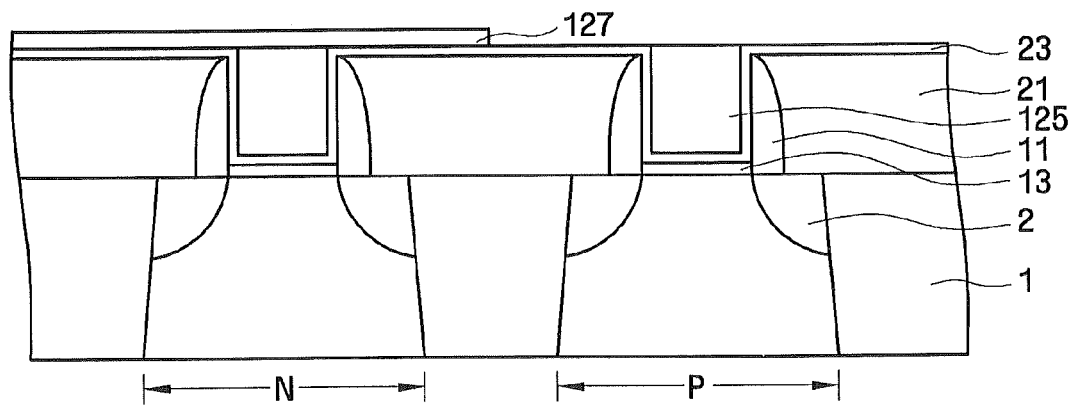

Next, referring to FIGS. 24 to 27, a mask layer 127 and a photoresist layer 129 for a photolithography process may be formed on upper portions of the first and second recesses 102, 202 that are substantially filled with the first metal layer 125. Exposure and developing processes may be performed to selectively remove portions of the photoresist layer 129 from the second region P. Referring to FIG. 25, the mask layer 127 on the second region P may be etched using portions of the photoresist layer 129 that remain in the first region N as a mask. Referring to FIG. 26, the photoresist layer 129 may be removed from the first region N, and the mask layer 127 may remain only in the first region N. Thereafter, according to some embodiments, the mask layer 127 may be removed using a wet etching process and/or a dry etching process.

Figure 27:
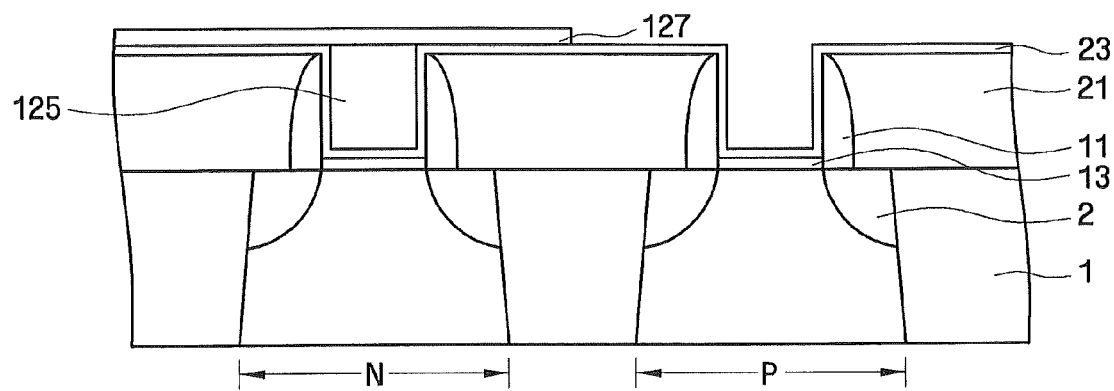

Referring to FIG. 27, in some embodiments, the first metal layer 125 substantially filling the second recess 202 may be removed using the mask layer 127 in first region N as a mask.

Figure 28:
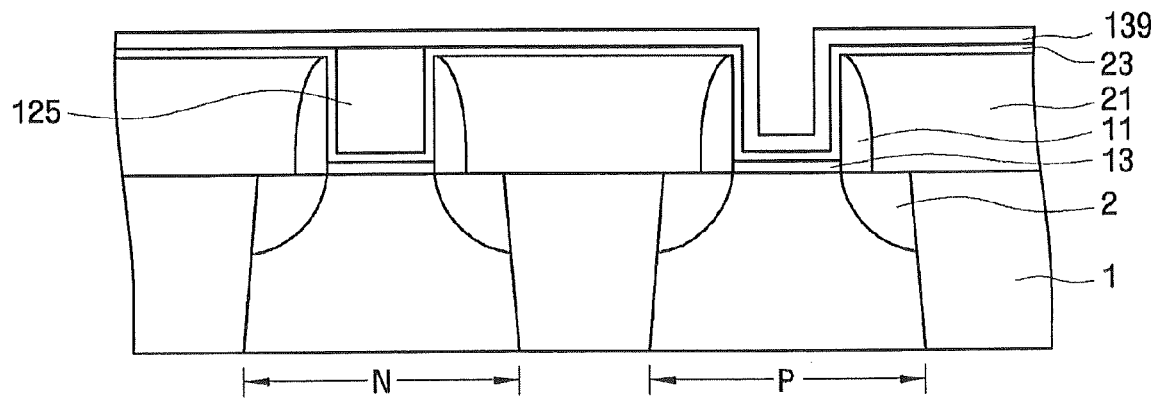

Referring to FIG. 28, a second metal layer 139 may be deposited on substantially the entire surface of the substrate 1. The first mask layer 127 in the first region N may be removed after the etching process. As shown in FIG. 28, the second metal layer 139 may be formed on a top portion of the substrate 1 (e.g., on the high-k layer 23) and may be formed on an inner surface of the open/partially-unfilled second recess 202 (e.g., on the high-k layer 23 between opposing sidewalls of the second recess 202) to a uniform thickness. In some embodiments, the second metal layer 139 may be deposited only on the second region P because of the portion of the mask layer 127 remaining in the first region N. After depositing the second metal layer 139, the mask layer 127 may be removed from the first region N. The second metal layer 139 may be used to form a gate electrode, and may be made of a metal such as tungsten (W), aluminum (Al), copper (Cu), titanium (Ti), or tantalum (Ta); a metallic nitride such as tungsten nitride (WN), titanium nitride (TiN), tantalum nitride (TaN), or boron nitride (BN); or polysilicon. Accordingly, titanium nitride (TiN), for example, may used in forming the second metal layer 139.

Figure 29:
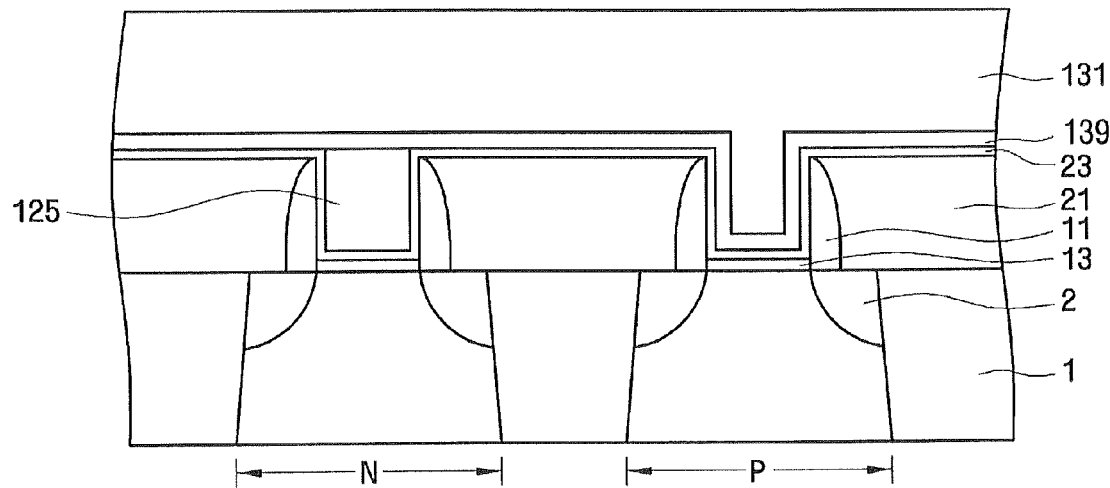
Figure 30:
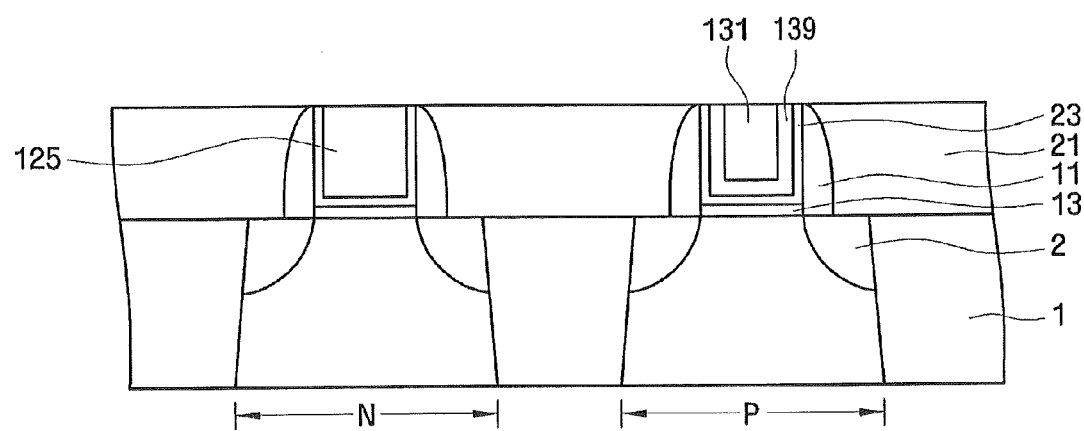

Referring to FIGS. 29 and 30, a third metal layer 131 may be formed on the second metal layer 139 to a thickness great enough to substantially fill a top/residual space of the second recess 202. As described regarding the first metal layer 125, the third metal layer 131 may be made of, for example, aluminum (Al). In some embodiments, the first and third metal layers 125, 131 may include the same material. A planarizing process may be performed on the third metal layer 131 (e.g., aluminum (Al)) to expose a portion (e.g., the sectional surface) of the second metal layer 139.

Referring to FIG. 30, the first region N, which may include an n-type transistor, may be formed directly using, for example, aluminum (Al), for the first metal layer 125, without forming a sacrificial layer, thereby providing a relatively simplified process.

While the present invention has been particularly shown and described with reference to various embodiments thereof, it will be understood by those of ordinary skill in the art that various changes in form and details may be made therein without departing from the spirit and scope of the inventive concept as defined by the following claims. Therefore, the above-disclosed subject matter is to be considered illustrative and not restrictive.

What is claimed is:

1. A method of forming a gate of a semiconductor device, the method comprising:

forming first and second dummy gate electrodes on first and second regions of a substrate, respectively;

forming gate spacers on opposing sidewalls of each of the first and second dummy gate electrodes;

forming an interlayer dielectric film on the gate spacers and on the first and second dummy gate electrodes to provide an n-type transistor in the first region and a p-type transistor in the second region;

forming first and second recesses in the first and second regions, respectively, by removing the first and second dummy gate electrodes;

forming a high-k layer by providing a high dielectric constant material in the first and second recesses and on the interlayer dielectric film;

providing a first metal on the high-k layer, the first metal substantially filling the first and second recesses, wherein a top surface of the first metal is located higher than a top surface of the interlayer dielectric film;
selectively removing the first metal from the second recess while at least a portion of the first metal remains in the first recess;
after selectively removing the first metal from the second recess, providing a second metal within the second recess; and
providing a third metal on the second metal, the third metal substantially filling the second recess.

2. The method of claim 1, wherein forming the first and second recesses comprises removing the first and second dummy gate electrodes by performing at least one of wet etching and dry etching.

3. The method of claim 1, wherein substantially filling the first and second recesses with the first metal is performed at a temperature of about 350° C. to about 400° C.

4. The method of claim 1, wherein selectively removing the first metal from the second recess comprises:
providing a mask layer on the first metal in the first and second regions;
removing the mask layer from the second region using a photolithography process to expose the first metal in the second recess; and
removing the exposed first metal from the second recess.

5. The method of claim 1, wherein substantially filling the second recess with the third metal comprises:
providing the third metal on the second metal in the first and second regions; and
planarizing the third metal to completely remove the third metal from the first region while a portion of the third metal remains within the second recess in the second region.

6. The method of claim 5, wherein planarizing the third metal comprises planarizing the third metal to completely remove the third metal from the first region and to substantially remove the second metal from the first region, while the portion of the third metal remains on a portion of the second metal within the second recess in the second region.

7. The method of claim 1, wherein the first and third metals comprise a same metal.

8. The method of claim 7, wherein the first and third metals comprise aluminum (Al).

9. The method of claim 7, wherein the first and third metals comprise titanium nitride (TiN).

10. The method of claim 1, wherein providing the third metal on the second metal comprises forming the third metal on the second metal in the first region while the first metal substantially fills the first recess.

11. A method of forming a gate of a semiconductor device, the method comprising:
forming a first recess in a first substrate region having a first conductivity type and forming a second recess in a second substrate region having a second conductivity type;
forming a high-k layer in the first and second recesses;
providing a first metal on the high-k layer in the first and second substrate regions, the first metal being provided within the second recess;
removing at least portions of the first metal from the second recess while protecting materials within the first recess from removal;
after removing at least portions of the first metal from the second recess, providing a second metal within the second recess; and
providing a third metal on the second metal within the second recess while the first metal remains in the first recess,
wherein providing the third metal on the second metal within the second recess comprises:
providing the third metal on the second metal in the first and second substrate regions; and
planarizing the third metal to remove the third metal from the first substrate region while a portion of the third metal remains within the second recess in the second substrate region, and
wherein the first and third metals comprise a same metal.

12. A method of forming a gate of a semiconductor device, the method comprising:
forming a first recess in a first substrate region having a first conductivity type and forming a second recess in a second substrate region having a second conductivity type;
forming a high-k layer in the first and second recesses;
providing a first metal on the high-k layer in the first and second substrate regions, the first metal being provided within the second recess;
removing at least portions of the first metal from the second recess while protecting materials within the first recess from removal, wherein removing at least portions of the first metal from the second recess comprises:
providing a mask layer on the first metal in the first and second substrate regions;
removing the mask layer from the second substrate region using a photolithography process to expose the first metal in the second recess; and
removing the exposed first metal from the second recess;
after removing at least portions of the first metal from the second recess, providing a second metal within the second recess; and
forming a third metal on the second metal in the first and second substrate regions; and
planarizing the third metal to completely remove the third metal from the first substrate region while a portion of the third metal remains within the second recess in the second substrate region.

13. The method of claim 12, wherein forming the third metal on the second metal comprises substantially filling the second recess with the third metal.

14. The method of claim 12, wherein forming the third metal on the second metal comprises forming the third metal on the second metal in the first substrate region while the first metal substantially fills the first recess.

15. The method of claim 12, wherein planarizing the third metal comprises planarizing the third metal to completely remove the third metal from the first substrate region and to substantially remove the second metal from the first substrate region, while the portion of the third metal remains on a portion of the second metal within the second recess in the second substrate region.

* * * * *